(12) United States Patent
Tramet et al.

(10) Patent No.: US 10,966,336 B2
(45) Date of Patent: Mar. 30, 2021

(54) BEARING WALL ELECTRICAL EQUIPMENT (71) Applicant: Valeo Siemens eAutomotive France SAS, Cergy (FR)

(72) Inventors: Guillaume Tramet, Montesson (FR); Roger Deniot, Poissy (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/226,837

(22) Filed: Dec. 20, 2018

(65) Prior Publication Data
US 2019/0200475 A1 Jun. 27, 2019

(30) Foreign Application Priority Data
Dec. 22, 2017 (FR) ...................................... 1762950

(51) Int. Cl.
*H05K 7/14* (2006.01)
*B60R 16/023* (2006.01)
(Continued)

(52) U.S. Cl.
CPC ....... *H05K 7/1432* (2013.01); *B60R 16/0239* (2013.01); *B60R 16/03* (2013.01);
(Continued)

(58) Field of Classification Search
CPC .. H05K 7/1432; H05K 5/0017; H05K 5/0247; B60L 53/22; B60R 16/0239;
(Continued)

(56) References Cited

U.S. PATENT DOCUMENTS 5,748,456 A * 5/1998 Bayerer ................ H01L 25/072
257/678
9,660,356 B1 * 5/2017 Nakamura ........... H05K 7/1432
(Continued)

FOREIGN PATENT DOCUMENTS

EP 1 870 969 A1 12/2007
EP 3 002 999 A1 4/2016
(Continued)

OTHER PUBLICATIONS

French Search Report for French Application No. 1762950 dated Aug. 21, 2018.

*Primary Examiner* — Hung S. Bui
*Assistant Examiner* — Sagar Shrestha
(74) *Attorney, Agent, or Firm* — McCormick, Paulding & Huber PLLC (57) ABSTRACT

The invention relates to an electrical equipment, in particular for electrical or hybrid vehicles, comprising a casing, said casing comprising a casing element comprising a side wall and defining an inner space. The side wall of the casing element comprises a material offset towards the inner space thereof forming a zone for connecting the positive terminal and the negative terminal of the electrical energy source such that said material offset overlaps the first electrical conductor and the second electrical conductor only making visible, from the outside of said side wall, the positive visible terminal and the negative visible terminal.

20 Claims, 4 Drawing Sheets

(51) Int. Cl.
  *B60R 16/03* (2006.01)
  *H01R 13/73* (2006.01)
  *H02G 5/00* (2006.01)
  *H02M 7/00* (2006.01)
  *H05K 5/00* (2006.01)
  *H05K 5/02* (2006.01)

(52) U.S. Cl.
  CPC ............... *H01R 13/73* (2013.01); *H02G 5/00* (2013.01); *H02M 7/003* (2013.01); *H05K 5/0017* (2013.01); *H05K 5/0247* (2013.01); *H01R 2201/26* (2013.01)

(58) Field of Classification Search
  CPC .... B60R 16/03; H01R 13/73; H01R 2201/26; H02G 5/00; H02M 7/003
  See application file for complete search history.

(56) References Cited

U.S. PATENT DOCUMENTS

| | | | | |
|---|---|---|---|---|
| 2004/0113268 A1* | 6/2004 | Shirakawa | ............. | H01L 25/18 257/724 |
| 2004/0228094 A1* | 11/2004 | Ahmed | ................. | H01L 25/072 361/702 |
| 2008/0186751 A1* | 8/2008 | Tokuyama | ............. | H01L 23/473 363/131 |
| 2009/0231811 A1* | 9/2009 | Tokuyama | ............... | H01L 23/36 361/699 |
| 2009/0237904 A1* | 9/2009 | Onishi | .................. | H02M 7/003 361/782 |
| 2014/0346659 A1* | 11/2014 | Nakamura | ............ | H02M 7/003 257/704 |
| 2015/0340966 A1* | 11/2015 | Mutsuura | ............... | H02M 7/003 363/98 |
| 2015/0373836 A1* | 12/2015 | Masutani | ............... | H01L 23/367 361/783 |
| 2016/0372392 A1* | 12/2016 | Sakamoto | ............... | H01L 25/50 |
| 2017/0278662 A1* | 9/2017 | Kitano | ............... | H01H 85/0241 |
| 2017/0345601 A1* | 11/2017 | Kitano | ................... | H01H 85/02 |
| 2017/0353118 A1* | 12/2017 | Hara | ...................... | H01L 23/40 |
| 2019/0206810 A1* | 7/2019 | Kanai | ................. | H05K 7/1432 |

FOREIGN PATENT DOCUMENTS

| | | |
|---|---|---|
| FR | 2 979 177 A1 | 2/2013 |
| WO | 2013102720 A1 | 7/2013 |
| WO | 2017081245 A1 | 5/2017 |

* cited by examiner

BEARING WALL ELECTRICAL EQUIPMENT

CROSS REFERENCE TO RELATED APPLICATION

This application claims foreign priority benefits under U.S.C. § 119 to French Patent Application No. 1762950 filed on Dec. 22, 2017, the content of which is hereby incorporated by reference in its entirety.

TECHNICAL FIELD

The present invention relates to the field of high voltage electrical equipment for electrical and hybrid vehicles and relates more specifically to a casing element for an electrical equipment, in particular for electrical and hybrid vehicles.

The invention aims in particular to make it possible for a reliable and secure connection of a supply battery on an electrical equipment.

BACKGROUND

As is known, an electrical or hybrid motor vehicle comprises an electrical motorisation system supplied by a high voltage supply battery via a high voltage embedded electrical network and a plurality of auxiliary electrical equipment supplied by a low voltage supply battery via a low voltage embedded electrical network. The high voltage supply battery ensures an energy supply function of the electrical motorisation system making it possible for the propulsion of the vehicle. More specifically, in order to control the electrical machine driving the wheels of the vehicle, it is known to use an inverter making it possible to convert the direct current supplied by the high voltage supply battery into one or more alternating control currents, for example sinusoidal.

In a known solution, the inverter is presented in the form of a casing wherein are mounted an electronic power module and an electronic control unit. The electronic power module comprises a body comprising electrical components through which energy passes supplying the electrical machine. The electronic control unit comprising electronic components making it possible to control the electronic power module.

For example, in the case where the electrical machine is a three-phase electrical motor, the electronic power module comprises three electrical conductors, called "phase conductors", making it possible to connect the electronic power module to the electrical motor in order to control it by using three currents called "phase currents" out of phase two by two, for example by 120°. These phase currents are generated by the inverter from the direct current delivered by the high voltage battery. In order to connect the electronic power module to the high voltage battery, the inverter further comprises an electrical conductor intended to be connected to the positive potential of the high voltage supply battery and an electrical conductor intended to be connected to the negative potential of the high voltage supply battery.

An electronic power module can be supplied with several positive terminals and several negative terminals intended to receive an electrical signal from an electrical energy source. Typically, the electrical signal is modified by the power components of the electronic power module to be delivered at the output of the electronic power module. However, in certain application, it is not necessary to deliver different electrical signals on the positive/negative terminal couples. It is thus necessary to connect each positive/negative terminal pair at the same electrical energy source. Between the electrical energy source, a connector must therefore be used for each terminal, which makes the connection of the electronic power module to the electrical energy source difficult.

In addition, the intensity of the currents could circulate in the electrical conductors connected to the high voltage supply battery being relatively increased, for example greater than 100 A, the arrangement of said electrical conductors can have an electrocution risk for an operator who would handle the inverter, in particular during the connection or the disconnection of the supply battery on the inverter, which has a major disadvantage.

There is therefore a need for a simple solution for connecting an electrical equipment to an electrical energy source.

SUMMARY

The invention relates to an electrical equipment, in particular for electrical or hybrid vehicles, comprising a casing, said casing comprising a casing element comprising a side wall and defining an inner space wherein are mounted:
  an electronic power module comprising a plurality of positive and negative outer terminal pairs, configured to exchange a supply energy with an electrical energy source,
  an electrical connection bar comprising a first electrical conductor and a second electrical conductor, the first electrical conductor comprising terminals in contact with the positive terminals of the electronic power module, so as to put the positive terminals at the same electrical potential by way of the first electrical conductor, the second electrical conductor comprising terminals in contact with the negative terminals of the electronic power module, so as to put the negative terminals at the same electrical potential by way of the second electrical conductor, at least one of said terminals of the first electrical conductor, called "positive visible terminal", and at least one of said terminals of the second electrical conductors, called "negative visible terminal", being adapted to be connected respectively to a positive terminal and to a negative terminal of an electrical energy source, an electrical equipment wherein the side wall of the casing element comprises a material offset towards the inner space thereof forming a zone for connecting the positive terminal and the negative terminal of the electrical energy source such that said material offset overlaps the first electrical conductor and the second electrical conductor by only making visible, from the outside of said side wall, the positive visible terminal and the negative visible terminal.

Thus, when the electronic power module and the electrical conductors are mounted in the casing element, the side wall forms a belt surrounding the electronic power module and partially covering the first electrical conductor and the second electrical conductor so as to only make visible, outside of said side wall, one single element for attaching each of the electrical conductors to a positive or negative terminal of the electrical energy source, for example a high voltage supply battery. The connection zone thus delimited has a limited surface which reduces the risks of electric shock for an operator. More specifically, a first part of the terminals of the first conductor are outside of the casing so as to form at least one outer terminal of the electrical equipment for a connection with the electrical energy source and a second part of the terminals of the first conductor are inside the casing. Likewise, a first part of the terminals of the second conductor are outside the casing so as to form at least one outer terminal of the electrical equipment for a connection with the electrical energy source and a second part of the terminals of the second conductor are inside the casing. The arrangement of the inner space defined by the side wall thus makes it possible to protect the second parts of the terminals of the electrical conductors from the outside, in order to avoid an operator touching them and receiving an electric shock. In other words, the material offset makes it possible to only make visible, from the outside, the useful portion of the potential electrical conductors in order to reduce the risks of electric shock. The second parts of the terminals of the electrical conductors are in the inner space of the casing, contrary to the prior art where they are outside the casing to be able to be connected to the electrical energy source. In addition, such an arrangement of the side wall makes it possible to increase the volume of the inner space of the casing element, such that an electronic control unit can extend, not only above the electronic power module, but also above the positive potential electrical conductor and above the negative potential electrical conductor. In the electrical equipment according to the invention, the electrical connection bar makes it possible to connect together, on the one hand, the positive terminals of the electronic power module, and on the other hand, the negative terminals of the electronic power module. Thus, it is not necessary to have a conductor for each positive or negative terminal of the electronic power module. All that is needed, is to connect the positive visible terminal with the positive terminal of the electrical energy source and the negative visible terminal with the negative terminal of the electrical energy source such that the terminals of the electronic power module receive, via the first electrical conductor and the second electrical conductor, the electrical signal generated by the electrical energy source. It is therefore easy to connect the electronic power module at the electrical energy source. Furthermore, the use of several pairs of connectors is avoided between the electronic power module and the electrical energy source, which reduces the input resistance of the electronic power module.

Preferably, the side wall has at least partially, a U-shape, the material offset forming the connection zone corresponding to the recess situated between the branches of the U.

Advantageously, the casing element further comprises a plurality of support elements connecting between them, a plurality of portions of the side wall and making it possible in particular for the support of the electronic power module, the first electrical conductor and the second electrical conductor.

Also preferably, the casing element is one-piece, which makes it solid, easy to handle during the assembly and easy to produce, in particular by overmoulding.

According to an aspect of the invention, the casing element being made of a plastic material, which makes it light, solid and easy to produce, in particular by overmoulding.

Advantageously, the electrical connection bar further comprises an attachment bar on which are mounted the first electrical conductor and the second electrical conductor.

According to an aspect of the invention, the electrical equipment further comprises a cover closing a face of the side wall of the casing element.

Advantageously, the electrical equipment further comprises an electronic control unit, said electronic control unit being mounted in the inner space defined by the side wall of the casing element and being configured to control the electronic power module, in particular such that it converts a direct current into at least one alternating current.

In an embodiment, the electrical equipment is an inverter configured to be electrically connected, on the one hand, to an electrical machine, in particular an electrical or hybrid vehicle and, on the other hand, to a high voltage supply battery, in particular of an electrical or hybrid vehicle.

According to an aspect of the invention, the electronic power module is capable of converting a direct current into a plurality of alternating currents called "phase currents". By the terms "electronic power module capable of converting a direct current into a plurality of alternating currents", this means that the electronic power module can be configured to convert a direct current into a plurality of alternating currents and/or to convert a plurality of alternating currents into a direct current.

In a preferred manner, the power module comprises a body.

According to an aspect of the invention, the first electrical conductor and the second electrical conductor are mounted on the body of the electronic power module.

The invention also relates to an electrical or hybrid vehicle comprising an electrical machine, for example a motorisation machine, supplied by a high voltage supply battery via an embedded high voltage electrical network and an electrical equipment, such as presented above, connected to said electrical machine.

BRIEF DESCRIPTION OF THE DRAWINGS

The invention will be best understood upon reading the following description, given only as an example, and by referring to the appended drawings given as non-limiting examples, wherein identical references are given to similar objects and on which.

It must be noted, that the figures describe the invention in a detailed manner, to implement the invention, said figures could of course be used to best define the invention, if necessary.

DETAILED DESCRIPTION

In the description which will be made below, the invention will be described in the application thereof to an electrical or hybrid motor vehicle without this being limiting of the scope of the present invention.

In the example described below, the vehicle comprises, in particular, an electrical machine, an electrical equipment being presented in the form of an inverter, a high voltage supply battery, an embedded high voltage electrical network, a low voltage supply battery, an embedded low voltage electrical network and a plurality of auxiliary electrical equipment.

The electrical equipment according to the invention is described below in the implementation thereof for an inverter, without however limiting the scope of the present invention. It will thus be noted, that the electrical equipment could be something else other than an inverter, for example a charger or DCDC converter embedded in the vehicle.

The embedded low voltage electrical network connects the low voltage supply battery and the plurality of auxiliary electrical equipment such that the low voltage supply battery supplies said auxiliary electrical equipment, such as embedded computers, window winder motors, a multimedia system, etc. The low voltage supply battery typically delivers, for example, a voltage of around 12V, 24V or 48V. The recharging of the low voltage battery is done from the high voltage battery via a direct voltage into direct voltage converter, commonly called DC/DC converter.

The embedded high voltage electrical network connects the high voltage supply battery and the inverter such that the high voltage supply battery ensures an energy supply function of the electrical machine via the inverter. The high voltage supply battery typically delivers a voltage of between 100V and 900V, preferably between 100V and 500V. The electrical energy recharging of the high voltage supply battery is made by connecting it, via the direct high voltage electrical network of the vehicle, to an outer electrical network, for example, the domestic alternating electrical network.

The electrical machine is a rotating electrical machine, preferably configured to drive the wheels of the vehicle from the energy supplied by the high voltage supply battery. More specifically, the electrical machine is an alternating current electrical machine supplied by a polyphase current source. For example, the electrical machine can be an alternating current motor. In the preferred example described below, the electrical machine is supplied by a three-phase current source without this being limiting of the scope of the present invention.

In this example, the control of the electrical machine is done by means of the inverter. Said inverter makes it possible to convert the direct current supplied by the high voltage supply battery into three alternating control currents, for example, sinusoidal. In other words, the inverter has the function of transforming the direct current delivered at the input by the high voltage supply battery into three phase currents making it possible to control the electrical machine. Conversely, in another operating mode, the electrical machine can also supply three alternating currents to the inverter such that said inverter transforms them into a direct current making it possible to charge the high voltage supply battery.

Figure 1:
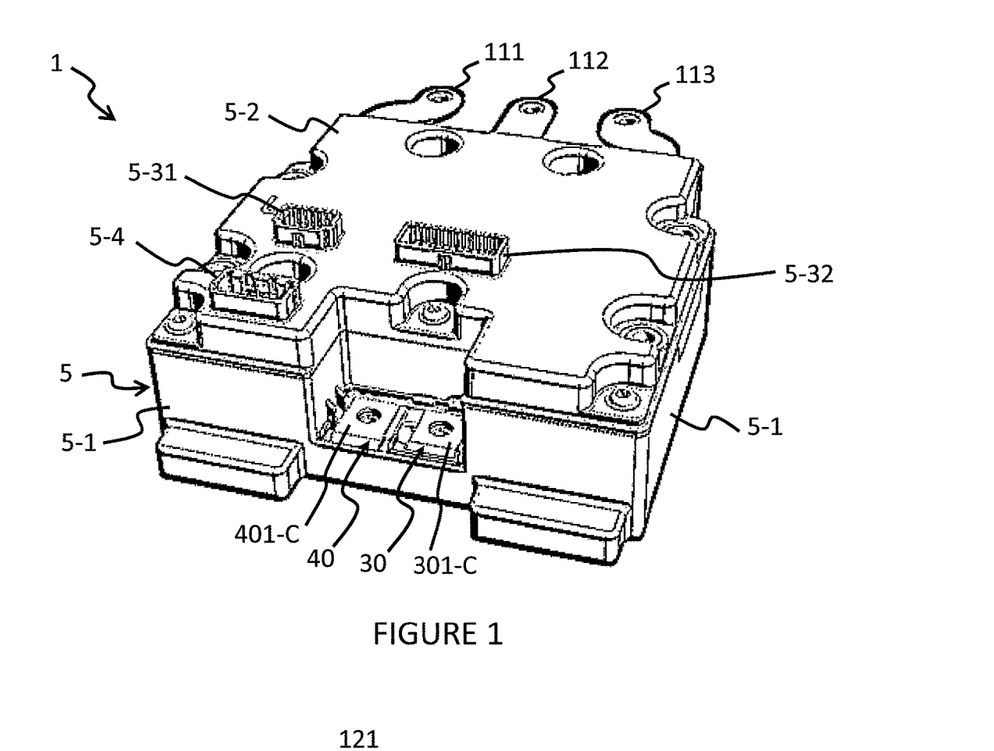
FIG. 1 is a perspective view of an embodiment of an inverter according to the invention.
Figure 2A:
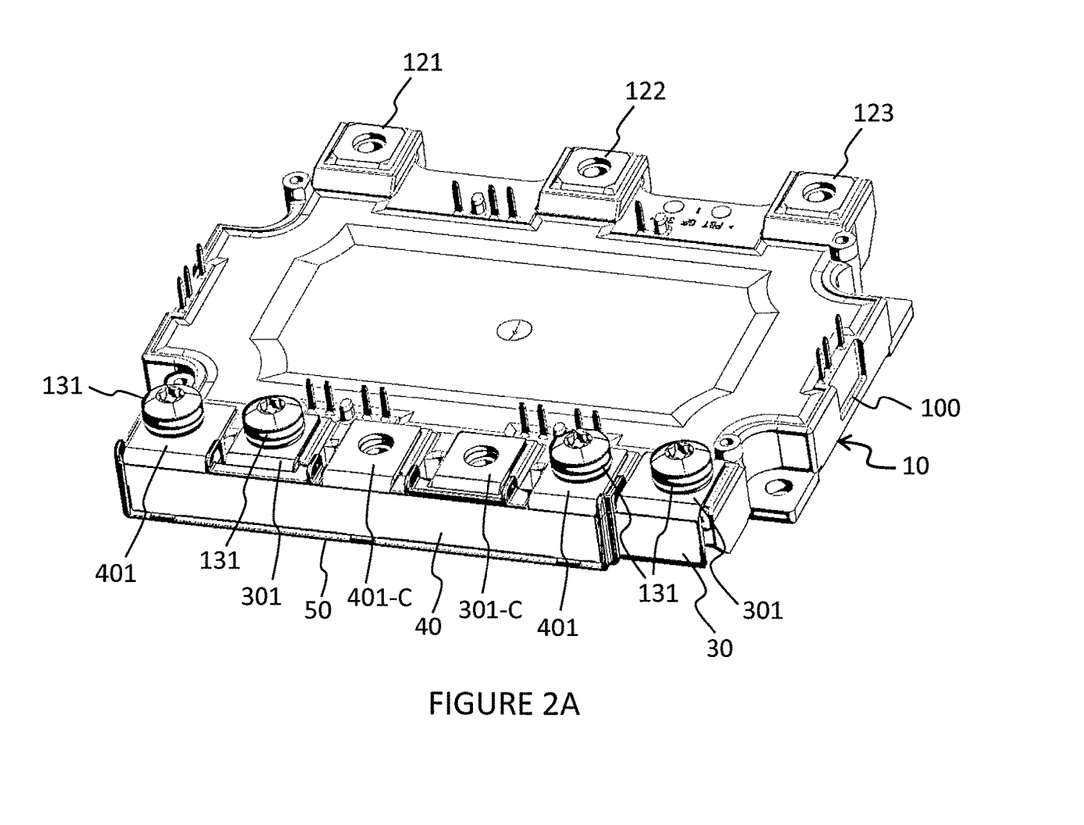
FIG. 2A is a partial, perspective view of the assembly formed of the electronic power module, the electronic control unit, the first positive potential electrical conductor, the negative potential electrical conductor and the attachment bar of the inverter of FIG. 1.
Figure 2B:
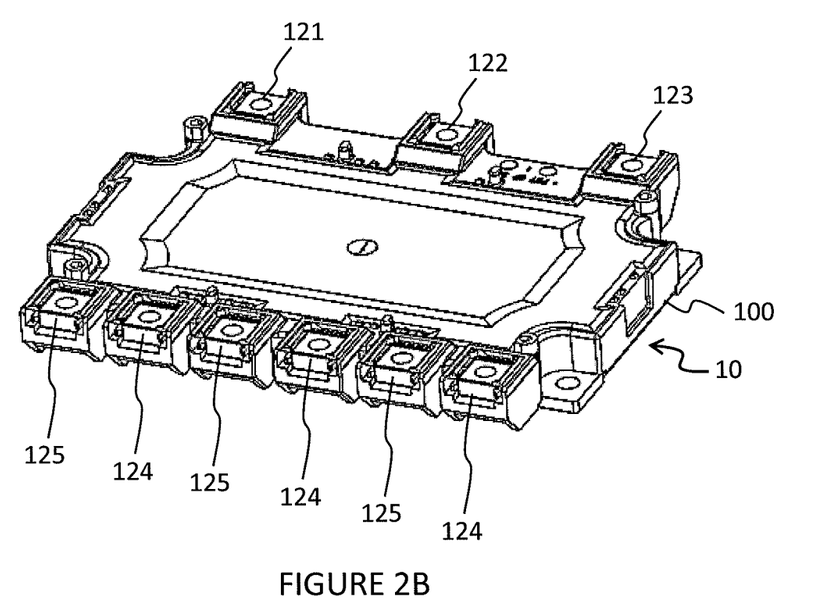
FIG. 2B is a partial, perspective view of the electronic power module.

In the example of FIGS. 1 and 2, the inverter 1 comprises a casing 5 wherein are mounted an electronic power module 10, an electronic control unit 20 and a plurality of electrical conductors 30, 40, 111, 112, 113 attached on said electronic power module 10.

Figure 3:
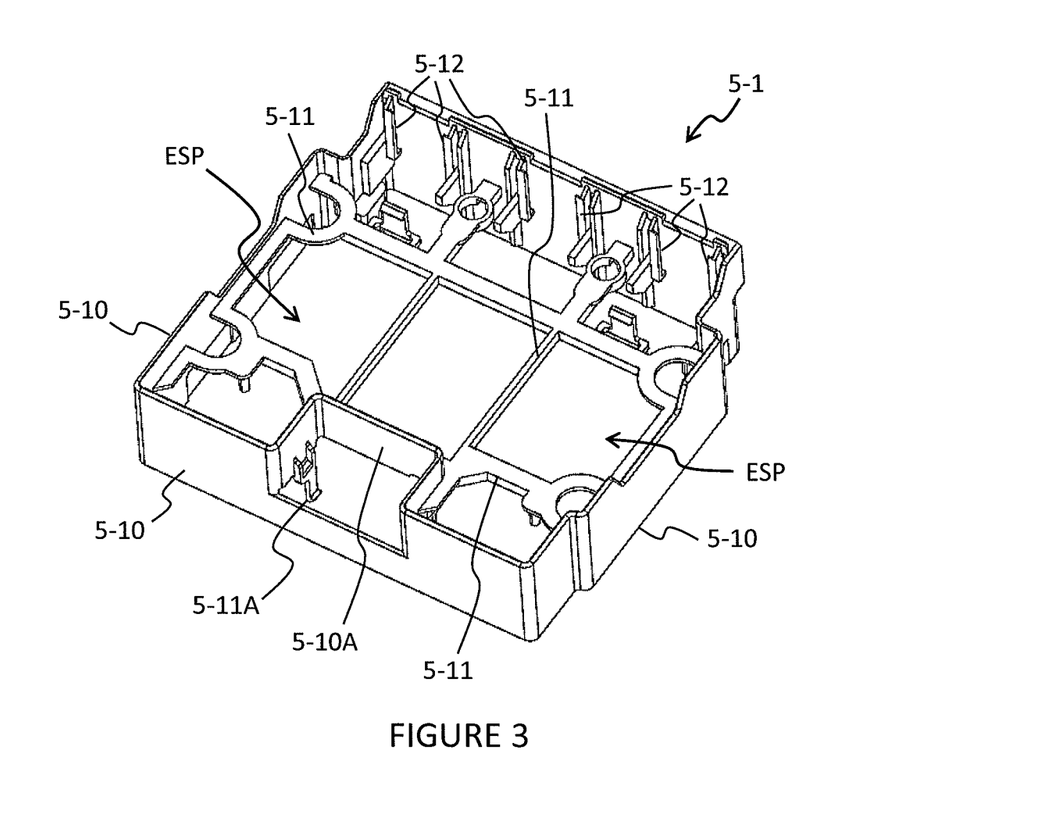
FIG. 3 is a perspective, top view of the casing element of the inverter of the figure.

In reference to FIGS. 1 to 3, the electronic power module 10 comprises a body 100 on which are attached the electrical conductors 30, 40, 111, 112, 113. Moreover, the electronic power module 10 comprises electronic power components through which the energy supplying the electrical machine passes, in particular configured to transform the direct current into alternating currents or vice versa. These electronic power components can comprise electronic switches, such as for example semi-conducting transistors, arranged in an electrical circuit to make it possible for an electrical energy controlled passage between the high voltage supply battery and the electrical machine. In particular, the electronic power components are bare semi-conducting chips for which the body 100 encapsulates.

In reference to FIG. 2B, the electronic power module 10 comprises nine outer electrical terminals, forming in particular, on the one hand, three phase ports 121, 122, 123, each delivering a phase current for controlling the motor and, on the other hand, three outer positive electrical terminals 124 and three outer negative electrical terminals 125.

In reference to FIGS. 1 and 2A, the inverter 1 comprises a first electrical conductor 30, configured to electrically connect the inverter 1 to the positive potential terminal of the high voltage supply battery (not represented), for example via a cable and a positive battery connector (not visible). The inverter 1 also comprises a second electrical conductor 40, configured to electrically connect the inverter 1 to the negative potential terminal of the high voltage supply battery, for example via a cable and a positive battery connector (not visible). The inverter 1 also comprises three conductors called "phase conductors" 111, 112, 113, configured to electrically connect the electronic power module 10 to the electrical machine.

In reference to FIG. 2A, each electrical conductor 30, 40 is presented in the form of a strip of which extend perpendicularly three attachment elements (or points) 301, 401, 301-C, 401-C. Among these three attachment elements 301, 401, the two attachment elements 301, 401 situated at the ends of the strip are used to attach the first electrical conductor 30 and the second electrical conductor 40 respectively on the outer positive electrical terminals 124 and on the outer negative electrical terminals 125 of the electronic power module 10 using a screw 131. The two central attachment elements 301-C, 401-C of the positive potential electrical conductor 30 and of the negative potential electrical conductor 40 are left free and visible in order to later connect the positive and negative terminals of the high voltage supply battery via electrical cables (not represented) attached on the two central attachment elements 301-C, 401-C using a screw. The two central attachment elements 301-C, 401-C thus constitute visible terminals, respectively positive and negative, respectively of the first electrical conductor 30 and of the second electrical conductor 40, having a dual electrical connection function, between the outer positive electrical terminals 124 and on the outer negative electrical terminals 125 of the electronic power module 10 and the positive and negative terminals of the high voltage supply battery, and for attaching the electrical cables of the positive and negative terminals of the high voltage supply battery on the first electrical conductor 30 and on the second electrical conductor 40.

Also in reference to FIG. 2A, the inverter 1 further comprises an electrically insulating attachment bar 50 separating the positive potential electrical conductor 30 of the negative potential electrical conductor 40, in particular in order to prevent the short-circuits between the positive potential electrical conductor 30 and the negative potential electrical conductor 40. To this end, the attachment bar 50 is preferably made of a plastic material such as, for example, PBT GF30.

Each phase conductor 111, 112, 113 makes it possible to electrically connect a phase of the electrical machine controlled by the inverter 1 with the electronic power module 10. It will be noted, that in another embodiment, the inverter 1 could comprise a number of different phase conductors 111, 112, 113, in particular a number according to the number of phases of the electrical machine controlled by the inverter 1. Each phase connector 111, 112, 113 is mounted on a corresponding phase port 121, 122, 123 of the electronic power module 10 by way of an attachment means, for example a screw (not represented). Each phase conductor 111, 112, 113 passes through an opening of the casing 5 to make it possible to connect the inverter 1 to the electrical machine and in particular, to make it possible for the circulation of alternating currents between the electronic power module 10 and the electrical machine.

The electronic control module 20 comprises components to control the components of the electronic power module 10. More specifically, the electronic control unit 20 controls the electronic power module 10, such that it achieves the conversion function of the direct current received from the high voltage battery, defining a direct voltage between the first electrical conductor 30 and the second electrical conductor 40, into three alternating phase currents for controlling the motor (or vice versa).

Figure 6:
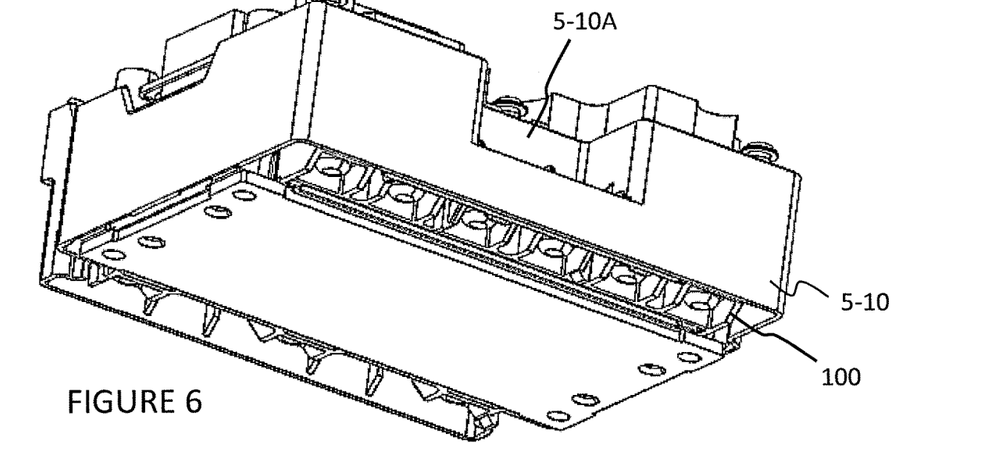
FIG. 6 is a perspective, bottom view of the assembly illustrated in FIG. 5.

As illustrated in FIG. 1, the casing 5 comprises a casing element 5-1 and a cover 5-2, mounted on the casing element 5. The inverter 1 comprises a bottom 6 extending under the casing element 5-1 (FIG. 6). In the example illustrated in FIG. 1, the inverter 1 further comprises, in a non-limiting manner, two signal connectors 5-31, 5-32 and a supply connector 5-4, mounted on the cover 5-2 of the casing 5. The signal connectors 5-31, 5-32 are configured to make it possible for an exchange of data signals between the components of the inverter 1 and the outside of the inverter 1, for example with a controller of the vehicle. In particular, these signal connectors 5-31, 5-32 can be connected to the electronic control unit 20. The supply connector 5-4, is configured to connect the inverter 1 to an electrical supply cable, for example connected to the embedded low voltage electrical network, in order to make it possible for the electrical supply of the electronic control unit 20.

Figure 4:
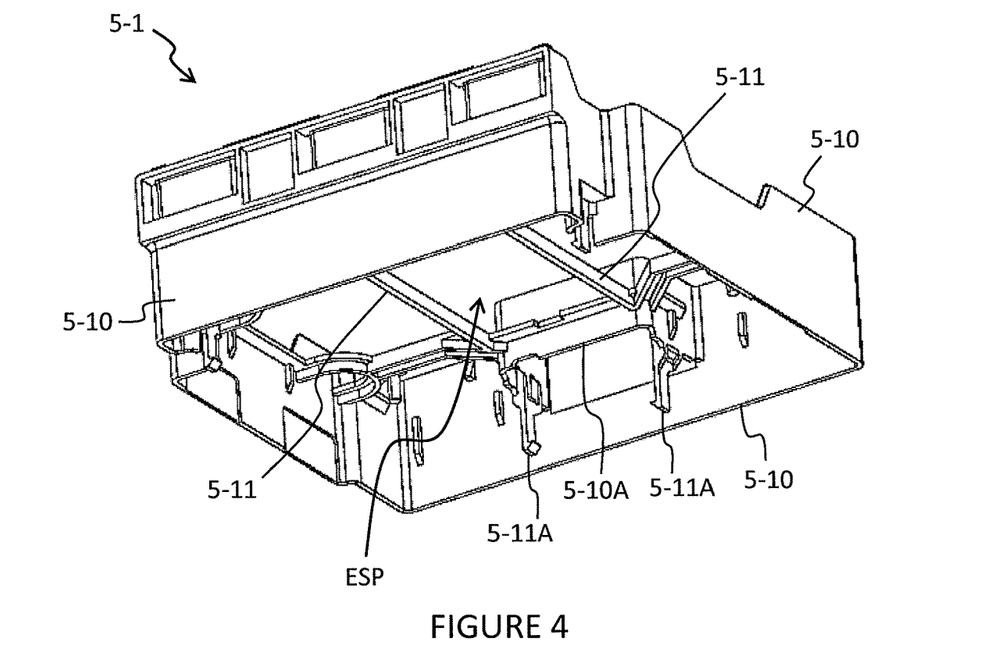
FIG. 4 is a perspective, bottom view of the casing element of the inverter of FIG. 1.

Now, in reference to FIGS. 3 and 4, the casing element 5-1 is presented in the form of a one-piece part produced by moulding an electrically insulating plastic material. The casing element 5-1 comprises a side wall 5-10 being presented in the form of a U-shaped belt and support elements 5-11 configured to receive the electronic power module 10 and the electronic control unit 20, when they are mounted in said inner space ESP. In this example, the support elements 5-11 comprise, in particular, stringers 5-11A making it possible to receive the body 100 of the electronic power module 10 and the electronic control unit.

Also in this example, the casing element 5 comprises blocking walls 5-12 making it possible to mount the phase conductors 111, 112, 113.

The side wall 5-10 of the casing element 5-1 comprises a material offset 5-10A towards the inner space (ESP) thereof forming a zone for connecting the positive terminal and the negative terminal of the high voltage supply battery.

Figure 5:
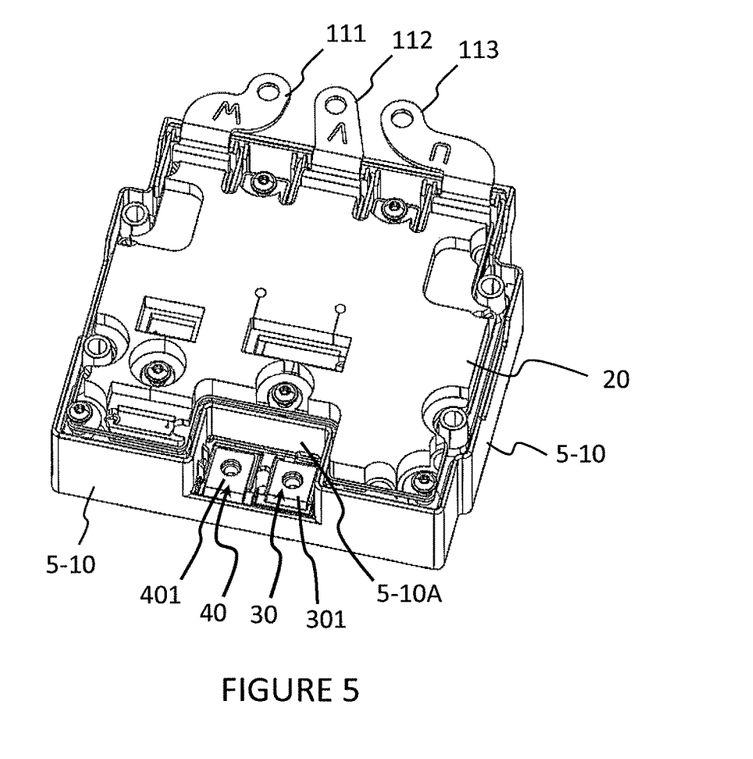
FIG. 5 is a perspective, top view of the casing element of FIGS. 3 and 4, wherein is mounted the assembly of FIG. 2A and three phase conductors.
Figure 7:
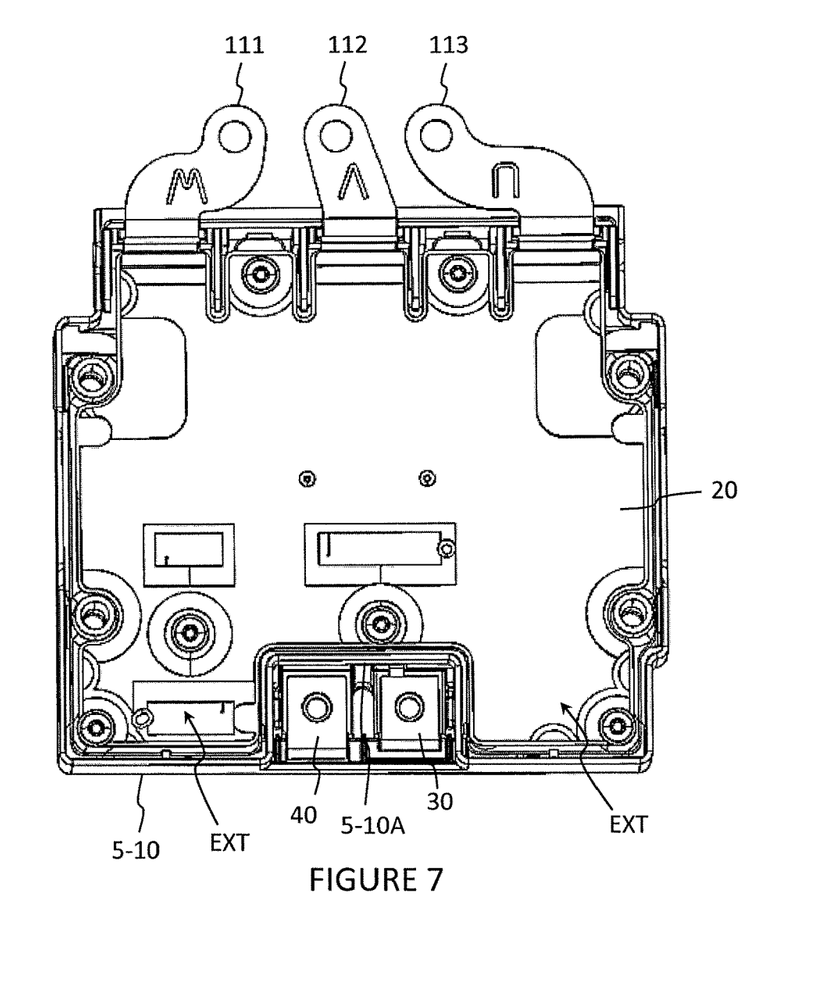
FIG. 7 is a partial, top view of the inverter of FIG. 1 showing the assembly of the electronic control unit on the electronic power module.

As illustrated in FIGS. 5 to 7, this material offset 5-10A overlaps the first electrical conductor 30 and the second electrical conductor 40 by only making visible, outside of said side wall 5-10, the central attachment element 301-C, 401C of each of the potential electrical conductors 30, 40.

In the example illustrated and in a non-limiting manner, the material offset 5-10A is formed such that the side wall 5-10 has a U-shaped part. The recess formed between the U-shaped branches, delimited by the material offset 5-10A of the side wall 5-10 towards the inner space ESP, constituting the zone for connecting the positive and negative terminals of the high voltage supply battery.

The material offset 5-10A thus makes it possible to limit the zone, visible and accessible to an operator of the electrical conductors 30, 40 (connection zone) in order to reduce the risk of electric shock by making it possible for the use of electrical conductors 30, 40 extending over the whole length of a side of the casing 5. Indeed, with the attachment surfaces of the electrical conductors 30, 40 being located in the inner space ESP defined by the side wall 5-10, they are no longer accessible for an operator who thus has the considerably reduced risk of receiving an electric shock. In addition, the extension of the side wall 5-10 of the casing 5 so as to cover the ends of the electrical conductors 30, 40 makes it possible to free the zones called "extension zones" EXT above said ends, which advantageously makes it possible to extend, in particular, the surface of the electronic board of the electronic control unit 20.

During the assembly of the inverter 1, the first electrical conductor 30 and the second electrical conductor 40 are firstly mounted on the insulating support bar 50, then the attachment elements 301, 401 thereof are attached to the outer positive electrical terminals 124 and on the outer negative electrical terminals 125 of the electronic power module 10 using four screws 131.

The body 100 of the electronic power module 10 is then positioned in the casing element 5-1.

Each phase conductor 111, 112, 113 is mounted by force, by sliding between each pair of walls 5-12A, 5-12B, so as to be blocked by the flutings between the first wall 5-12A and the second wall 5-12B of each pair of walls 5-12A, 5-12B, then screwed on the corresponding phase port 121, 122, 123 so as to electrically connect it to said phase ports 121, 122, 123 of the electronic power module 10.

The electronic control module 20 is then mounted on the electronic power module 10. The cover 5-2 of the casing 5 is then to be fixed on the casing element 5-1 so as to close the casing 5. Likewise, the bottom 6 is attached on the body of the electronic power module 10 so as to partially cover it, as illustrated in FIG. 6, in particular in order to limit the risks for an operator of receiving an electric shock by touching the body 100.

The phase conductors 111, 112, 113 of the inverter 1 can then be electrically connected to the electrical machine, as well as the electrical conductors 30, 40 can be electrically connected, via the positive and negative visible terminals, respectively to the positive and negative potential terminals of the high voltage supply battery of the vehicle.

The invention is not limited to the sole example described above. The figures represent a specific embodiment example, which combines several embodiments. However, the characteristics connected to the embodiments can be independent to one another from one embodiment to the other, or combined with one another as emerges from the claims.

What is claimed is:

1. Electrical equipment, in particular for electrical or hybrid vehicles, comprising a casing, said casing comprising a casing element comprising a side wall and defining an inner space wherein are mounted:
   an electronic power module comprising a plurality of pairs of outer positive and negative terminals configured to exchange a supply energy with an electrical energy source,
   an electrical connection bar comprising a first electrical conductor and a second electrical conductor, the first electrical conductor comprising terminals in contact with the positive terminals of the electronic power module, so as to put the positive terminals at the same electrical potential by way of the first electrical conductor, the second electrical conductor comprising terminals in contact with the negative terminals of the electronic power module, so as to put the negative terminals at the same electrical potential by way of the second electrical conductor, one of said terminals of the first electrical conductor, called "positive visible terminal", and one of said terminals of the second electrical conductor, called "negative visible terminal", being adapted to be connected respectively to a positive terminal and a negative terminal of an electrical energy source, electrical equipment wherein the side wall of the casing element comprises a material offset towards the inner space thereof forming a zone for connecting the positive terminal and the negative terminal of the electrical energy source such that said material offset overlaps the first electrical conductor and the second electrical conductor by only making visible, from the outside of said side wall, the positive visible terminal and the negative visible terminal, and wherein the casing element comprises stringers which are arranged adjacent to the material offset and are configured to receive a body of the electronic power module.

2. The electrical equipment according to claim 1, wherein, the side wall has at least partially a U-shape, the material offset forming a connection zone corresponding to the recess situated between the U-shaped branches.

3. The electrical equipment according to claim 2, further comprising a plurality of support elements connecting between them, a plurality of portions of the side wall and making it possible in particular for the support of the electronic power module, the first electrical conductor and the second electrical conductor.

4. The electrical equipment according to claim 2, said casing element being one-piece.

5. The electrical equipment according to claim 2, said casing element being made of a plastic material.

6. The electrical equipment according to claim 2, wherein the electrical connection bar further comprises an attachment bar on which are mounted the first electrical conductor and the second electrical conductor.

7. The electrical equipment according to claim 1, further comprising a plurality of support elements connecting between them, a plurality of portions of the side wall and making it possible in particular for the support of the electronic power module, the first electrical conductor and the second electrical conductor.

8. The electrical equipment according to claim 7, said casing element being one-piece.

9. The electrical equipment according to claim 7, said casing element being made of a plastic material.

10. The electrical equipment according to claim 7, wherein the electrical connection bar further comprises an attachment bar on which are mounted the first electrical conductor and the second electrical conductor.

11. The electrical equipment according to claim 1, said casing element being one-piece.

12. The electrical equipment according to claim 11, said casing element being made of a plastic material.

13. The electrical equipment according to claim 11, wherein the electrical connection bar further comprises an attachment bar on which are mounted the first electrical conductor and the second electrical conductor.

14. The electrical equipment according to claim 1, said casing element being made of a plastic material.

15. The electrical equipment according to claim 14, wherein the electrical connection bar further comprises an attachment bar on which are mounted the first electrical conductor and the second electrical conductor.

16. The electrical equipment according to claim 1, wherein the electrical connection bar further comprises an attachment bar on which are mounted the first electrical conductor and the second electrical conductor.

17. The electrical equipment according to claim 1, further comprising a cover closing a face of the side wall of the casing element.

18. The electrical equipment according to claim 1, further comprising an electronic control unit, said electronic control unit being mounted in the inner space defined by the side wall of the casing element and being configured to control the electronic power module, in particular such that it converts a direct current into at least one alternating current.

19. The electrical equipment according to claim 1, said electrical equipment being an inverter configured to be electrically connected, on the one hand, to an electrical machine, in particular of an electrical or hybrid vehicle and, on the other hand, to a high voltage supply battery.

20. The electrical equipment according to claim 19, wherein the electronic power module is capable of converting a direct current into a plurality of alternating currents called "phase currents".

* * * * *